United States Patent

Okuyama et al.

[11] Patent Number: 6,118,209
[45] Date of Patent: Sep. 12, 2000

[54] PIEZOELECTRIC CERAMIC COMPOSITION AND PIEZOELECTRIC TRANSFORMER

[75] Inventors: Kojiro Okuyama, Ikoma; Toshiyuki Asahi; Masamitsu Nishida, both of Osaka; Hiroyuki Hase, Kyoto, all of Japan

[73] Assignee: Matsushita Electric Industrial Co., Ltd., Osaka, Japan

[21] Appl. No.: 09/336,673

[22] Filed: Jun. 21, 1999

[30] Foreign Application Priority Data

Jun. 19, 1998 [JP] Japan .................. 10-173662
May 6, 1999 [JP] Japan .................. 11-126423

[51] Int. Cl.$^7$ .................................................. H01L 41/08
[52] U.S. Cl. .................... 310/358; 310/359; 310/366; 252/62.9
[58] Field of Search .................... 310/358, 359, 310/366; 252/62.9

[56] References Cited

U.S. PATENT DOCUMENTS

| | | | |
|---|---|---|---|
| 3,998,748 | 12/1976 | Nishida et al. | 252/62.9 |
| 5,320,910 | 6/1994 | Banno | 310/358 X |
| 5,402,791 | 4/1995 | Saitoh et al. | 310/358 X |
| 5,410,209 | 4/1995 | Yamashita et al. | 310/358 X |
| 5,721,464 | 2/1998 | Dibbern et al. | 310/358 |

FOREIGN PATENT DOCUMENTS 56-30714  7/1981  Japan .

*Primary Examiner*—Mark O. Budd
*Attorney, Agent, or Firm*—Smith, Gambrell & Russell, LLP

[57] ABSTRACT

A piezoelectric ceramic composition represents a composition formula, $(Pb_u A_{1-u})_v \{(Zn_{1/3}Nb_{2/3})_w (Sn_{1/3}Nb_{2/3})_x Ti_y Zr_z\}_{2-v} O_3$, where the symbol A is at least one component selected from a group consisting of La, Nd, Pr, and Bi, and u, v, w, x, y, and z are within ranges represented by the following Equations, characterized in that 0.1 to 3 mole percent of a Mn compound calculated in terms of $MnO_2$ is added to said piezoelectric ceramic composition.

$w+x+y+z=1$ [Equation 1]

$0.85 \leq u \leq 0.99$ $0.97 \leq v \leq 1.03$ $0.01 \leq w \leq 0.20$ $0.01 \leq x \leq 0.15$ $0.35 \leq y \leq 0.48$ $0.30 \leq z \leq 0.50$

20 Claims, 2 Drawing Sheets

PIEZOELECTRIC CERAMIC COMPOSITION AND PIEZOELECTRIC TRANSFORMER

BACKGROUND OF THE INVENTION

1. Field of the Invention

The present invention relates to a piezoelectric ceramic composition suited, for example, for ultrasonic oscillators, actuators, piezoelectric transformers, or the like, and to a piezoelectric transformer used in electric power conversion devices such as an inverter for the back light of a liquid crystal display.

2. Description of the Prior Art

Piezoelectric materials are applied to various devices, such as ultrasonic oscillators, actuators, and piezoelectric transformers, as materials which can convert electrical energy to mechanical oscillation energy or mechanical oscillation energy to electrical energy. In these applications, piezoelectric materials having a large electromechanical coupling factor and a large mechanical quality factor are used. An example of such piezoelectric materials is a composition comprising $Pb(Zn_{1/3}Nb_{2/3})O_3$—$Pb(Sn_{1/3}Nb_{2/3})O_3$—$PbTiO_3$—$PbZrO_3$ to which $MnO_2$ is added, which has been known to have an excellent piezoelectric properties (see Japanese Patent Publication No. 56-30714).

In recent years, increase in the output of piezoelectric devices is demanded. However, the mechanical quality factor of piezoelectric materials lowers non-linearly due to high-field driving and increase in mechanical vibration, and piezoelectric materials abruptly generate large heat due to the loss of internal energy. Therefore, piezoelectric materials having a mechanical quality factor which lowers little even at high-field driving have been demanded.

With recent downsizing of office automation facilities, piezoelectric transformers have been diffused for producing inverters for cold cathode-ray tubes used as the back light of a liquid display, and for other applications. A piezoelectric transformer converts inputted electrical energy to mechanical oscillation energy, then to electrical energy again, thereby steps up or steps down the input voltage. For piezoelectric transformers used in such applications, high conversion efficiency and a small and thin size are demanded.

Also, a piezoelectric transformer is a device utilizing the resonance of a piezoelectric element, and when oscillation in the length direction is used, the resonant frequency increases with decrease in the length of the element. That is, downsizing leads to increase in driving frequencies. However, if driving frequencies are increased, the conversion efficiency of the entire circuit containing a piezoelectric transformer, such as an inverter circuit, is lowered by the effect of floating capacity in the vicinity of the circuit, the frequency characteristics of the cold cathode-ray tube, or the like. Therefore, small piezoelectric transformers which can be driven by a relatively low frequency are demanded.

BRIEF SUMMARY OF THE INVENTION

Object of the Invention

The above-described conventional materials exhibit excellent piezoelectric properties at low-field driving. However, their mechanical quality factor lowers significantly at high-field driving.

The first object of the present invention is to provide a piezoelectric ceramic composition having a large mechanical quality factor, which lowers little even at high-field driving, considering the problems of conventional piezoelectric materials; and to provide a piezoelectric device which generates little heat even at high-field driving, and enables high outputs, produced using such a piezoelectric ceramic composition as the piezoelectric material.

When a piezoelectric device of a laminated structure is formed, the effect of omitting the process for bonding the electrode and the piezoelectric material is obtained by sintering a silver-palladium paste and the piezoelectric ceramic composition at the same time, for facilitating the production of the piezoelectric device of a laminated structure. The upper limit of the sintering temperature when the silver-palladium paste and the piezoelectric ceramic composition at the same time is 1150° C., and it was difficult for conventional materials to tolerate such a temperature. Furthermore, for decreasing the palladium content in the silver-palladium paste to reduce the material costs, the sintering temperature is preferably lower than 1100° C.

The second object of the present invention is to provide a piezoelectric ceramic composition which can be sintered at a temperature lower than 1100° C., and having a large mechanical quality factor, which lowers little even at high-field driving and to provide a piezoelectric device which generates little heat even at high-field driving, and enables high outputs, produced using such a piezoelectric ceramic composition as the piezoelectric material.

Also, on inputting a certain electrical energy to a piezoelectric transformer, if the piezoelectric material is made thin, the step up (step down) ratio increases, but conversion efficiency lowers.

The third object of the present invention is to provide a thin piezoelectric transformer having a high conversion efficiency.

Furthermore, on inputting a certain electrical energy to a piezoelectric transformer, if the driving frequency of the piezoelectric transformer is lowered, the amplitude of mechanical oscillation increases and conversion efficiency lowers.

The fourth object of the present invention is to provide a small piezoelectric transformer having a high conversion efficiency even at low driving -frequencies.

Summary of the Invention

The first invention of the present invention is a piezoelectric ceramic composition represented by a composition formula, $(Pb_u A_{1-u})_v \{(Zn_{1/3}Nb_{2/3})_w (Sn_{1/3}Nb_{2/3})_x Ti_y Zr_z\}_{2-v} O_3$, where the symbol A is at least one component selected from a group consisting of La, Nd, Pr, and Bi, and u, v, w, x, y, and z are within ranges represented by the following Equations, characterized in that 0.1 to 3 mole percent of a Mn compound calculated in terms of $MnO_2$ is added to said piezoelectric ceramic composition.

$$w+x+y+z=1 \qquad \text{[Equation 1]}$$

$$0.85 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

According to a first aspect of the present invention, there can be provided a piezoelectric ceramic composition having a large mechanical quality factor, and achieving little lowering of the mechanical quality factor due to high-field driving.

The second invention of the present invention is a piezoelectric ceramic composition represented by a composition formula, $[(Pb_uA_{1-u})_v\{(Zn_{1/3}Nb_{2/3})_w(Sn_{1/3}Nb_{2/3})_xTi_yZr_z\}_{2-v}O_3]_t$—$(YMnO_3)_{1-t}$, where the symbol A is at least one component selected from a group consisting of La, Nd, Pr, and Bi, and t, u, v, w, x, y, and z are within ranges represented by the following Equations.

$$w+x+y+z=1 \quad \text{[Equation 2]}$$

$$0.960 \leq t \leq 0.999$$

$$0.90 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

According to a second aspect of the present invention, there can be provided a piezoelectric ceramic composition having a large mechanical quality factor, and achieving little lowering of the mechanical quality factor due to high-field driving.

The third invention of the present invention is a piezoelectric ceramic composition represented by a composition formula, $(Pb_uA_{1-u})_v\{(Zn_{1/3}Nb_{2/3})_w(Sn_{1/3}Nb_{2/3})_xTi_yZr_z\}_{2-v}O_3$, where the symbol A is at least one component selected from a group consisting of La, Nd, Pr, and Bi, and u, v, w, x, y, and z are within ranges represented by the following Equations, characterized in that 0.1 to 3 mole percent of a Mn compound calculated in terms of $MnO_2$, and 0.5 to 2 mole percent of ZnO are added to said piezoelectric ceramic composition.

$$w+x+y+z=1 \quad \text{[Equation 1]}$$

$$0.85 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

According to a third aspect of the present invention, there can be provided a piezoelectric ceramic composition which can be sintered at a temperature lower than 1100° C., and having a large mechanical quality factor, and achieving little lowering of the mechanical quality factor due to high-field driving.

The fourth invention of the present invention is a piezoelectric ceramic composition represented by a composition formula, $[(Pb_uA_{1-u})_v\{(Zn_{1/3}Nb_{2/3})_w(Sn_{1/3}Nb_{2/3})_xTi_yZr_z\}_{2-v}O_3]_t$—$(YMnO_3)_{1-t}$, where the symbol A is at least one component selected from a group consisting of La, Nd, Pr, and Bi, and t, u, v, w, x, y, and z are within ranges represented by the following Equations, characterized in that 0.5 to 2 mole percent of ZnO is added to said piezoelectric ceramic composition.

$$w+x+y+z=1 \quad \text{[Equation 2]}$$

$$0.960 \leq t \leq 0.999$$

$$0.90 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

According to a fourth aspect of the present invention, there can be provided a piezoelectric ceramic composition which can be sintered at a temperature lower than 1100° C., and having a large mechanical quality factor, and achieving little lowering of the mechanical quality factor due to high-field driving.

The fifth invention of the present invention is a piezoelectric device characterized in that the piezoelectric ceramic composition according to the first invention to the second invention is used as the piezoelectric body.

According to a fifth aspect of the present invention, there can be provided a piezoelectric device which generates little heat on high-field driving, and can produce a high output.

The sixth invention of the present invention is a piezoelectric transformer characterized in that the piezoelectric device according to the fifth invention is used as the piezoelectric transformer.

According to a sixth aspect of the present invention, there can be provided a piezoelectric transformer having a high conversion efficiency and a thin thickness.

The seventh invention of the present invention is the piezoelectric transformer according to the sixth invention comprising a polarizing portion in the length direction and a polarizing portion in the thickness direction.

According to a seventh aspect of the present invention, there can be provided a piezoelectric transformer having a high conversion efficiency and a thin thickness.

The eighth invention of the present invention is the piezoelectric transformer according to the seventh invention excited in a half-wavelength mode.

According to an eighth aspect of the present invention, there can be provided a piezoelectric transformer having a high conversion efficiency even at a low driving frequency, and having a small size.

The ninth invention of the present invention is a piezoelectric device, characterized by comprising the piezoelectric ceramic composition according to the third invention or the fourth invention, and silver-palladium paste electrodes.

According to a ninth aspect of the present invention, there can be provided a piezoelectric device which generates little heat on high-field driving, and can produce a high output.

The tenth invention of the present invention is a piezoelectric transformer characterized in that the piezoelectric device according to the ninth invention is used as the piezoelectric transformer.

According to a tenth aspect of the present invention, there can be provided a piezoelectric transformer having a high conversion efficiency and a thin thickness.

The eleventh invention of the present invention is the piezoelectric transformer according to the tenth invention, characterized by comprising a polarizing portion in the length direction and a polarizing portion in the thickness direction.

According to an eleventh aspect of the present invention, there can be provided a piezoelectric transformer having a high conversion efficiency and a thin thickness.

The twelfth invention of the present invention is the piezoelectric transformer according to the eleventh invention, characterized by excited in a half-wavelength mode.

According to a twelfth aspect of the present invention, there can be provided a piezoelectric transformer having a high conversion efficiency even at a low driving frequency, and having a small size.

The piezoelectric devices and piezoelectric transformers according to the ninth through twelfth aspects of the present invention have features that they are easily laminated by sintering a piezoelectric ceramic composition together with a silver-palladium paste.

DESCRIPTION OF SYMBOLS 1, 5 Piezoelectric body driving portion
2, 6, 7 Piezoelectric body power generating portion
3, 8 Input electrode
4, 9 Output electrode

DETAILED DESCRIPTION OF THE PREFERRED EMBODIMENTS

The embodiments of the present invention will be described below referring to attached drawings.
(First Embodiment)

Figure 1:
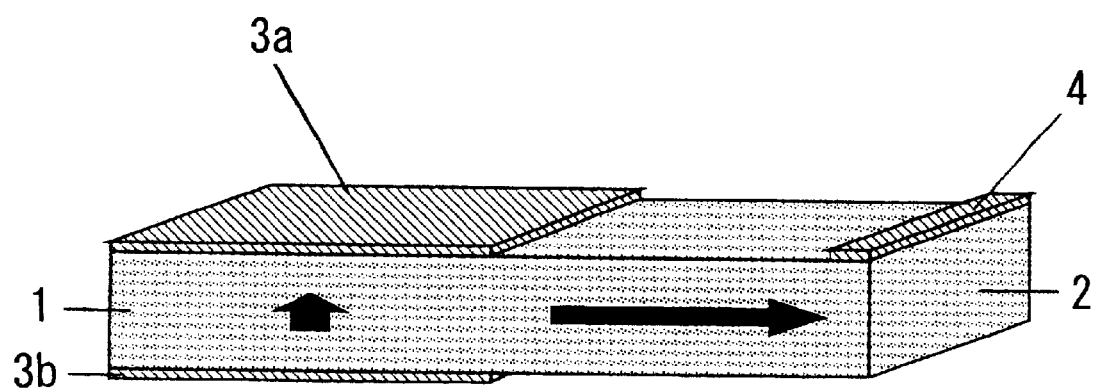
FIG. 1 is a perspective view showing the appearance of a piezoelectric transformer according to the first and second embodiments of the present invention.

First, the first embodiment of the present invention will be described below referring to attached drawings. FIG. 1 is a perspective view showing the appearance of the piezoelectric transformer according to the first embodiment of the present invention. Arrows in FIG. 1 show the directions of the polarizing axes of the piezoelectric body. A piezoelectric body driving portion 1 having input electrodes 3$a$ and 3$b$ formed on the major surface of the piezoelectric body has been subjected to the polarizing treatment in the thickness direction; and a piezoelectric body power generating portion 2 having an output electrode 4 formed on the end surface of the piezoelectric body has been subjected to the polarizing treatment in the length direction between the input electrodes 3$a$, 3$b$ and the output electrode 4.

Next, the operation of the piezoelectric transformer according to this embodiment will be described. When AC electric signal is impressed between the input electrodes 3$a$ and 3$b$, the piezoelectric body driving portion 1 is excited to make mechanical oscillation due to the reverse piezoelectric effect. By the piezoelectric effect of this mechanical oscillation, a voltage is generated between the output electrode 4 and the (common electrode of) input electrodes 3, and taken out as an electric signal. By this, the input voltage is converted into an output voltage. The relationship between the input voltage and the output voltage is determined by the size of the piezoelectric body, the frequency of the impressed AC electric signal, and so on. In this type of piezoelectric transformer, the voltage is most efficiently converted by the oscillation of the one-wavelength mode ($\lambda$-mode) on the stretching oscillation in the length direction of the piezoelectric body (the piezoelectric body driving portion 1+the piezoelectric body power generating portion 2). The input electrodes 3$a$, 3$b$ and the output electrode 4 have been formed by, for example, silver baking.

The piezoelectric body driving portion 1 and the piezoelectric body power generating portion 2 are piezoelectric ceramic compositions represented by a composition formula, $(Pb_uA_{1-u})_v\{(Zn_{1/3}Nb_{2/3})_w(Sn_{1/3}Nb_{2/3})_xTi_yZr_z\}_{2-v}O_3$, where the symbol A is at least one component selected from a group (A) consisting of La, Nd, Pr, and Bi, and u, v, w, x, y, and z are within ranges represented by the following Equations, to which 0.1 to 3 mole percent of a Mn compound calculated in terms of $MnO_2$ is added.

$w+x+y+z=1$ [Equation 1]

$0.85 \leq u \leq 0.99$ $0.97 \leq v \leq 1.03$ $0.01 \leq w \leq 0.20$ $0.01 \leq x \leq 0.15$ $0.35 \leq y \leq 0.48$ $0.30 \leq z \leq 0.50$ The piezoelectric ceramic composition according to this embodiment has been proved to have a large mechanical quality factor, and to achieve little lowering of the mechanical quality factor due to high-field driving by satisfying the above requirements, the details of which will be described referring to Examples mentioned later.

Also, the piezoelectric transformer according to this embodiment has been proved to have a high conversion efficiency, and to realize a thin thickness by the use of the above-described piezoelectric ceramic composition, the details of which will be described referring to Examples mentioned later.

As a modification of this embodiment, in place of the piezoelectric ceramic composition according to this embodiment, there may be used a piezoelectric ceramic composition represented by a composition formula, $[(Pb_uA_{1-u})_v\{(Zn_{1/3}Nb_{2/3})_w(Sn_{1/3}Nb_{2/3})_xTi_yZr_z\}_{2-v}O_3]_t—(YMnO_3)_{1-t}$, where the symbol A is at least one component selected from a group (A) consisting of La, Nd, Pr, and Bi, and t, u, v, w, x, y, and z are within ranges represented by the following Equations.

$w+x+y+z=1$ [Equation 2]

$0.960 \leq t \leq 0.999$ $0.90 \leq u \leq 0.99$ $0.97 \leq v \leq 1.03$ $0.01 \leq w \leq 0.20$ $0.01 \leq x \leq 0.15$ $0.35 \leq y \leq 0.48$ $0.30 \leq z \leq 0.50$ In this modified embodiment, it has also been proved that the same effects as those of the piezoelectric ceramic composition and the piezoelectric transformer according to the embodiment described above can be obtained, and the details will also be described referring to Examples mentioned later.
(Second Embodiment)

Next, the second embodiment of the present invention will be described below referring to attached drawings. This embodiment is similar to the piezoelectric transformer in the first embodiment described above except for the aspects related to the piezoelectric ceramic composition of the present invention. In this embodiment, therefore, what are not described are the same as those in the first embodiment, and the composing members having the same nominations have the same functions as those of the first embodiment unless otherwise described.

The construction of the piezoelectric transformer in this embodiment is the same as that shown in FIG. 1.

The input electrodes 3a and 3b, and the output electrode 4 are formed by silver baking, or by sintering a silver-palladium paste.

The piezoelectric body driving portion 1 and the piezoelectric body power generating portion 2 are piezoelectric ceramic compositions represented by a composition formula, $(Pb_uA_{1-u})_v\{(Zn_{1/3}Nb_{2/3})_w(Sn_{1/3}Nb_{2/3})_xTi_yZr_z\}_{2-v}O_3$, where the symbol A is at least one component selected from a group (A) consisting of La, Nd, Pr, and Bi, and u, v, w, x, y, and z are within ranges represented by the following Equations, to which 0.1 to 3 mole percent of a Mn compound calculated in terms of $MnO_2$ and 0.5 to 2 mole percent of ZnO are added.

$$w+x+y+z=1 \quad \text{[Equation 1]}$$

$$0.85 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

The piezoelectric ceramic composition according to this embodiment has been proved to be able to be sintered at a temperature below 1100° C., to have a large mechanical quality factor, and to achieve little lowering of the mechanical quality factor due to high-field driving by satisfying the above requirements, the details of which will be described referring to Examples mentioned later.

Also, the piezoelectric transformer according to this embodiment has been proved to have a high conversion efficiency, and to realize a thin thickness by the use of the above-described piezoelectric ceramic composition, the details of which will be described referring to Examples mentioned later.

When a piezoelectric transformer in this embodiment is manufactured, since the above piezoelectric ceramic composition can be sintered at a temperature below 1100° C., it can be sintered together with a silver-palladium paste forming the electrodes to form a laminated structure; therefore, a piezoelectric device having a laminated structure can be easily manufactured.

As a modification of this embodiment, in place of the piezoelectric ceramic composition according to this embodiment, there may be used a piezoelectric ceramic composition represented by a composition formula, $[(Pb_uA_{1-u})_v\{(Zn_{1/3}Nb_{2/3})_w(Sn_{1/3}Nb_{2/3})_xTi_yZr_z\}_{2-v}O_3]_t$—$(YMnO_3)_{1-t}$, where the symbol A is at least one component selected from a group (A) consisting of La, Nd, Pr, and Bi, and t, u, v, w, x, y, and z are within ranges represented by the following Equations, to which 0.5 to 2 mole percent of ZnO is further added.

$$w+x+y+z=1 \quad \text{[Equation 2]}$$

$$0.960 \leq t \leq 0.999$$

$$0.90 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

In this modified embodiment, it has also been proved that the same effects as those of the piezoelectric ceramic composition and the piezoelectric transformer according to the embodiment described above can be obtained, and the details will also be described referring to Examples mentioned later.

(Third Embodiment)

Next, the third embodiment of the present invention will be described below referring to attached drawings.

Figure 2:
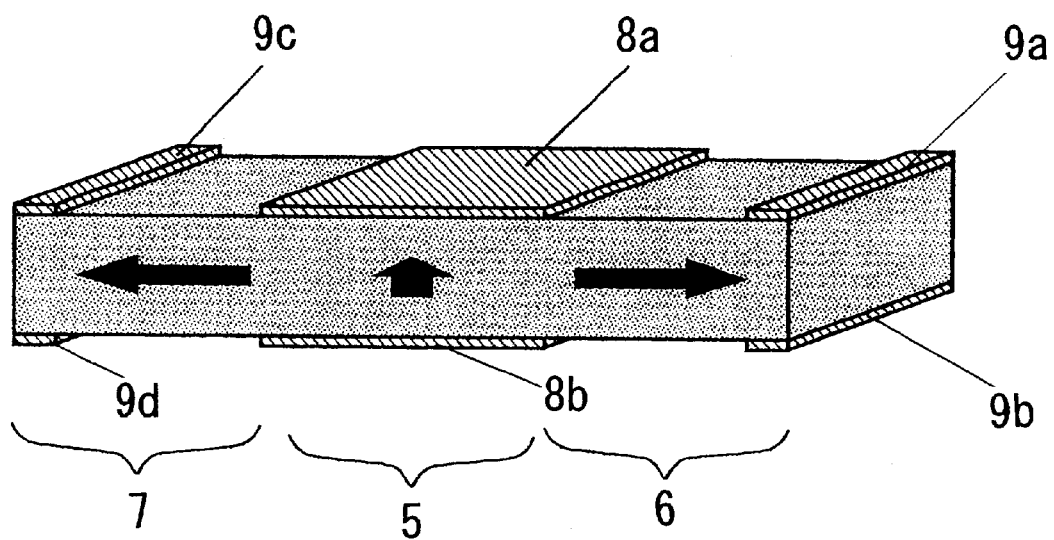
FIG. 2 is a perspective view showing the appearance of a piezoelectric transformer according to the third and fourth embodiments of the present invention.

FIG. 2 is a perspective view showing the appearance of the piezoelectric transformer according to the third embodiment of the present invention. Arrows in FIG. 2 show the directions of the polarizing axes of the piezoelectric body. A piezoelectric body driving portion 5 having input electrodes 8a and 8b formed on the major surface of the piezoelectric body has been subjected to the polarizing treatment in the thickness direction; and in a piezoelectric body power generating portions 6 and 7, both sides of the piezoelectric body driving portion 5 have been subjected to the polarizing treatment in the length direction and output electrodes 9a, 9b, 9c, and 9d are formed on the both surfaces of the both ends, respectively.

The operation of the piezoelectric transformer according to this embodiment will be described. When AC electric signal is impressed between the input electrodes 8a and 8b, the piezoelectric body driving portion 5 is excited to make mechanical oscillation due to the reverse piezoelectric effect. By the piezoelectric effect of this mechanical oscillation, a voltage is generated between the output electrodes 9a, 9b and the input electrodes 8a, 8b, and between the output electrodes 9c, 9d and the input electrodes 8a, 8b, and taken out as an electric signal. By this, the input voltage is converted into an output voltage. The relationship between the input voltage and the output voltage is determined by the size of the piezoelectric body, the frequency of the impressed AC electric signal, and so on. In this type of piezoelectric transformer, the voltage is most efficiently converted by the oscillation of the half-wavelength mode ($\lambda/2$-mode) on the stretching oscillation in the length direction of the piezoelectric body (the piezoelectric body driving portion 5+the piezoelectric body power generating portions 6 and 7). The oscillation frequency of the $\lambda/2$-mode is a half the oscillation frequency of the one-wavelength mode.

The input electrodes 8a, 8b, and the output electrodes 9a, 9b, 9c, and 9d have been formed by, for example, silver baking.

The piezoelectric body driving portion 5 and the piezoelectric body power generating portions 6 and 7 are piezoelectric ceramic compositions represented by a composition formula, $(Pb_uA_{1-u})_v\{(Zn_{1/3}Nb_{2/3})_w(Sn_{1/3}Nb_{2/3})_xTi_yZr_z\}_{2-v}O_3$, where the symbol A is at least one component selected from a group (A) consisting of La, Nd, Pr, and Bi, and u, v, w, x, y, and z are within ranges represented by the following Equations, to which 0.1 to 3 mole percent of a Mn compound calculated in terms of $MnO_2$ is added.

$$w+x+y+z=1 \quad \text{[Equation 1]}$$

$$0.85 \leq u \leq 0.99$$

$$0.97 \leq v \leq 1.03$$

$0.01 \leq w \leq 0.20$ $0.01 \leq x \leq 0.15$ $0.35 \leq y \leq 0.48$ $0.30 \leq z \leq 0.50$ The piezoelectric ceramic composition according to this embodiment has been proved to have a large mechanical quality factor, and to achieve little lowering of the mechanical quality factor due to high-field driving by satisfying the above requirements, the details of which will be described referring to Examples mentioned later.

Also, the piezoelectric transformer according to this embodiment has been proved to have a high conversion efficiency even at a low driving frequency, and to realize a thin thickness by the use of the above-described piezoelectric ceramic composition, the details of which will be described referring to Examples mentioned later.

Although a centrally driving type construction as shown in FIG. 2 is used as a $\lambda/2$-mode piezoelectric transformer according to this embodiment, the structure is not specifically limited, but the same effect can be obtained from the construction having a polarizing portion in the length direction and a polarizing portion in the thickness direction and which can be excited in $\lambda/2$ mode, such as the construction shown in FIG. 1.

As a modification of this embodiment, in place of the piezoelectric ceramic composition according to this embodiment, there may be used a piezoelectric ceramic composition represented by a composition formula, $[(Pb_uA_{1-u})_v\{(Zn_{1/3}Nb_{2/3})_w(Sn_{1/3}Nb_{2/3})_xTi_yZr_z\}_{2-v}O_3]_t$—$(YMnO_3)_{1-t}$, where the symbol A is at least one component selected from a group (A) consisting of La, Nd, Pr, and Bi, and t, u, v, w, x, y, and z are within ranges represented by the following Equations.

$w+x+y+z=1$ [Equation 2]

$0.960 \leq t \leq 0.999$ $0.90 \leq u \leq 0.99$ $0.97 \leq v \leq 1.03$ $0.01 \leq w \leq 0.20$ $0.01 \leq x \leq 0.15$ $0.35 \leq y \leq 0.48$ $0.30 \leq z \leq 0.50$ In this modified embodiment, it has also been proved that the same effects as those of the piezoelectric ceramic composition and the piezoelectric transformer according to the embodiment described above can be obtained, and the details will also be described referring to Examples mentioned later.

(Fourth Embodiment)

Next, the fourth embodiment of the present invention will be described below referring to attached drawings. This embodiment is similar to the piezoelectric transformer in the third embodiment described above except for the aspects related to the piezoelectric ceramic composition of the present invention. In this embodiment, therefore, what are not described are the same as those in the third embodiment, and the composing members having the same nominations have the same functions as those of the third embodiment unless otherwise described. The construction of the piezoelectric transformer in this embodiment is the same as that shown in FIG. 2. The input electrodes 8a and 8b, and the output electrodes 9a, 9b, 9c, and 9d are formed, for example, by silver baking, or by sintering a silver-palladium paste.

The piezoelectric body driving portion 5 and the piezoelectric body power generating portions 6 and 7 are piezoelectric ceramic compositions represented by a composition formula, $(Pb_uA_{1-u})_v\{(Zn_{1/3}Nb_{2/3})_w(Sn_{1/3}Nb_{2/3})_xTi_yZr_z\}_{2-v}O_3$, where the symbol A is at least one component selected from a group (A) consisting of La, Nd, Pr, and Bi, and u, v, w, x, y, and z are within ranges represented by the following Equations, to which 0.1 to 3 mole percent of a Mn compound calculated in terms of $MnO_2$ and 0.5 to 2 mole percent of ZnO are added.

$w+x+y+z=1$ [Equation 1]

$0.85 \leq u \leq 0.99$ $0.97 \leq v \leq 1.03$ $0.01 \leq w \leq 0.20$ $0.01 \leq x \leq 0.15$ $0.35 \leq y \leq 0.48$ $0.30 \leq z \leq 0.50$ The piezoelectric ceramic composition according to this embodiment has been proved to be able to sinter at a temperature below 1100° C., to have a large mechanical quality factor, and to achieve little lowering of the mechanical quality factor due to high-field driving by satisfying the above requirements, the details of which will be described referring to Examples mentioned later.

Also, the piezoelectric transformer according to this embodiment has been proved to have a high conversion efficiency even at a low driving frequency, and to realize a thin thickness by the use of the above-described piezoelectric ceramic composition, the details of which will be described referring to Examples mentioned later.

Although a centrally driving type construction as shown in FIG. 2 is used as a $\lambda/2$-mode piezoelectric transformer according to this embodiment, the structure is not specifically limited, but the same effect can be obtained from the construction having a polarizing portion in the length direction and a polarizing portion in the thickness direction and which can be excited in $\lambda/2$ mode, such as the construction shown in FIG. 1.

When a piezoelectric transformer in this embodiment is manufactured, since the above piezoelectric ceramic composition can be sintered at a temperature below 1100° C., it can be sintered together with a silver-palladium paste forming the electrodes to form a laminated structure; therefore, a piezoelectric device having a laminated structure can be easily manufactured.

As a modification of this embodiment, in place of the piezoelectric ceramic composition according to this embodiment, there may be used a piezoelectric ceramic composition represented by a composition formula, $[(Pb_uA_{1-u})_v\{(Zn_{1/3}Nb_{2/3})_w(Sn_{1/3}Nb_{2/3})_xTi_yZr_z\}_{2-v}O_3]_t$—$(YMnO_3)_{1-t}$, where the symbol A is at least one component selected from a group (A) consisting of La, Nd, Pr, and Bi, and t, u, v, w, x, y, and z are within ranges represented by the following Equations, to which 0.5 to 2 mole percent of ZnO is further added.

$w+x+y+z=1$ [Equation 2]

$0.960 \leq t \leq 0.999$ $0.90 \leq u \leq 0.99$ $0.97 \leq v \leq 1.03$ $0.01 \leq w \leq 0.20$ $0.01 \leq x \leq 0.15$ $0.35 \leq y \leq 0.48$ $0.30 \leq z \leq 0.50$ In this modified embodiment, it has also been proved that the same effects as those of the piezoelectric ceramic composition and the piezoelectric transformer according to the embodiment described above can be obtained, and the details will also be described referring to Examples mentioned later.

In the first through fourth embodiments described above, although piezoelectric transformers using the piezoelectric ceramic composition of the present invention were described, the application of the piezoelectric ceramic composition of the present invention is not limited to piezoelectric transformers and it can also be applied to various piezoelectric devices including ultrasonic oscillators and actuators. Through the application of the piezoelectric ceramic composition of the present invention, piezoelectric devices with reduced thickness and size, and laminated piezoelectric devices which can be produced easily are realized.

EXAMPLES

The Examples of the present invention will be described below.

The following Examples correspond to the first through fourth embodiments described above and the modifications thereof, and show the results of the tests for the effects described above using Examples of the piezoelectric ceramic compositions and piezoelectric transformers corresponding to these embodiments, and Comparative Examples thereof.

Example 1

Examples of the piezoelectric ceramic compositions according to the first through fourth embodiments, and Comparative Examples thereof, will be described below.

As the starting materials of the Examples, PbO, $La_2O_3$, $Nd_2O_3$, $Pr_2O_3$, $Bi_2O_3$, ZnO, $SnO_2$, $Nb_2O_5$, $TiO_2$, $ZrO_2$, $MnCO_3$, and $Y_2O_3$ of chemically high purity were used. These were weighed to form a predetermined composition, and wet-mixed with a ball mill using zirconia balls. Here, the quantity of $MnCO_3$ was calculated to obtain a required quantity of $MnO_2$. As the starting materials, any of oxides, hydroxides, carbonates, or alkoxides of each component element described above can also be used. The mixture was taken out from the ball mill, dried, and calcined in the air at 850–1100° C. for 2 hours. The calcined powder was wet-ground with the above-described ball mill, then the ground slurry was taken out from the ball mill, dried, and granulated with a polyvinyl alcohol solution.

Granules thus obtained were molded into a disc having a diameter of 20 mm and a thickness of about 2 mm using a mold and a press. After the binder was removed from the molded article by allowing the molded article to stand in the air at 700° C. for 1 hour, the molded article was sintered in the air at 1000–1260° C. for 2 hours. After the sintered article was machined into a disc having a diameter of about 16 mm and a thickness of about 1 mm, silver electrodes were formed on the both major surface of the disc by baking, and polarization treatment was performed in an insulation oil at 100° C. by impressing a DC electric field of 1–5 kV/mm. From the measurement of the obtained disc specimen with the resonance-antiresonance method using an impedance analyzer, the mechanical quality factor Qm of the oscillation in the radial direction of the disc was obtained. Here, the Qm values when the impressed voltage was 0.1 Vrms and when it was 5 Vrms were obtained to evaluate the degree of Qm lowering due to high-field driving.

Table 1 shows the compositions, sintering temperatures, and Qm values when the impressed voltage was 0.1 Vrms and when it was 5 Vrms. Asterisks (*) indicated to the right of the specimen numbers indicate that such samples are beyond the scope of the claim of the present invention.

TABLE 1

| Specimen No. | A | u | v | w | x | y | z | $MnO_2$ (Mole %) | ZnO (Mole %) | Sintering temperature (° C.) | Qm 0.1 V | Qm 5 V |
|---|---|---|---|---|---|---|---|---|---|---|---|---|
| 1* | — | 1 | 1 | 0.09 | 0.09 | 0.42 | 0.40 | 1 | 0 | 1230 | 2200 | 700 |
| 2 | La | 0.99 | 1 | 0.09 | 0.09 | 0.42 | 0.40 | 1 | 0 | 1230 | 2180 | 1200 |
| 3 | La | 0.94 | 1 | 0.09 | 0.09 | 0.42 | 0.40 | 1 | 0 | 1230 | 2350 | 1830 |
| 4 | La | 0.85 | 1 | 0.09 | 0.09 | 0.42 | 0.40 | 1 | 0 | 1230 | 1560 | 1420 |
| 5* | La | 0.75 | 1 | 0.09 | 0.09 | 0.42 | 0.40 | 1 | 0 | 1260 | 980 | 500 |
| 6 | Bi | 0.99 | 1 | 0.09 | 0.09 | 0.42 | 0.40 | 1 | 0 | 1230 | 2010 | 1310 |
| 7 | Bi | 0.94 | 1 | 0.09 | 0.09 | 0.42 | 0.40 | 1 | 0 | 1200 | 1870 | 1700 |
| 8 | Bi | 0.90 | 1 | 0.09 | 0.09 | 0.42 | 0.40 | 1 | 0 | 1170 | 1650 | 1580 |
| 9 | La½Bi½ | 0.94 | 1 | 0.09 | 0.09 | 0.42 | 0.40 | 1 | 0 | 1200 | 2150 | 2050 |
| 10* | La | 0.94 | 0.90 | 0.09 | 0.09 | 0.42 | 0.40 | 1 | 0 | 1260 | 320 | 120 |
| 11 | La | 0.94 | 0.97 | 0.09 | 0.09 | 0.42 | 0.40 | 1 | 0 | 1260 | 1600 | 1350 |
| 12 | La | 0.94 | 1.03 | 0.09 | 0.09 | 0.42 | 0.40 | 1 | 0 | 1200 | 2210 | 1740 |
| 13* | La | 0.94 | 1.1 | 0.09 | 0.09 | 0.42 | 0.40 | 1 | 0 | 1170 | 560 | 330 |
| 14* | — | 1 | 1 | 0 | 0 | 0.48 | 0.52 | 1 | 0 | 1140 | 700 | 150 |
| 15 | La | 0.96 | 1 | 0.01 | 0.01 | 0.48 | 0.50 | 1 | 0 | 1110 | 1520 | 1120 |
| 16 | La | 0.96 | 1 | 0.20 | 0.15 | 0.35 | 0.30 | 1 | 0 | 1260 | 1750 | 1530 |
| 17* | La | 0.96 | 1 | 0.25 | 0.25 | 0.29 | 0.21 | 1 | 0 | 1260 | 850 | 730 |
| 18* | La | 0.94 | 1 | 0.09 | 0.09 | 0.42 | 0.40 | 0 | 0 | 1260 | 530 | 120 |
| 19 | La | 0.94 | 1 | 0.09 | 0.09 | 0.42 | 0.40 | 0.1 | 0 | 1260 | 1230 | 1100 |
| 20 | La | 0.94 | 1 | 0.09 | 0.09 | 0.42 | 0.40 | 2 | 0 | 1260 | 1890 | 1780 |
| 21 | La | 0.94 | 1 | 0.09 | 0.09 | 0.42 | 0.40 | 3 | 0 | 1260 | 1580 | 1420 |

TABLE 1-continued

| Specimen No. | A | u | v | w | x | y | z | MnO$_2$ (Mole %) | ZnO (Mole %) | Sintering temperature (° C.) | Qm 0.1 V | Qm 5 V |
|---|---|---|---|---|---|---|---|---|---|---|---|---|
| 22* | La | 0.94 | 1 | 0.09 | 0.09 | 0.42 | 0.40 | 4 | 0 | 1260 | 620 | 310 |
| 23 | La | 0.99 | 1 | 0.12 | 0.06 | 0.42 | 0.40 | 1 | 0 | 1110 | 2150 | 1500 |
| 24 | La | 0.94 | 1 | 0.12 | 0.06 | 0.42 | 0.40 | 1 | 0 | 1140 | 2350 | 2120 |
| 25 | La | 0.96 | 1 | 0.09 | 0.05 | 0.43 | 0.43 | 1 | 0 | 1110 | 2260 | 1840 |
| 26 | La | 0.96 | 1 | 0.09 | 0.05 | 0.43 | 0.43 | 0.1 | 0 | 1110 | 1420 | 1210 |
| 27 | La | 0.96 | 1 | 0.09 | 0.05 | 0.43 | 0.43 | 3 | 0 | 1110 | 1830 | 1700 |
| 28 | Nd | 0.94 | 1 | 0.09 | 0.09 | 0.42 | 0.40 | 1 | 0 | 1260 | 2430 | 2230 |
| 29 | Nd | 0.94 | 1 | 0.09 | 0.09 | 0.42 | 0.40 | 1 | 0.5 | 1080 | 2250 | 2030 |
| 30 | Nd | 0.94 | 1 | 0.09 | 0.09 | 0.42 | 0.40 | 1 | 1 | 1080 | 2000 | 1760 |
| 31 | Nd | 0.94 | 1 | 0.09 | 0.09 | 0.42 | 0.40 | 1 | 2 | 1000 | 1750 | 1520 |
| 32* | Nd | 0.94 | 1 | 0.09 | 0.09 | 0.42 | 0.40 | 1 | 4 | 1000 | 800 | 680 |
| 33 | Pr | 0.94 | 1 | 0.09 | 0.09 | 0.42 | 0.40 | 1 | 0 | 1230 | 2000 | 1880 |
| 34 | Pr | 0.94 | 1 | 0.09 | 0.09 | 0.42 | 0.40 | 1 | 1 | 1080 | 1960 | 1790 |

As is obvious from the results shown in Table 1, specimens corresponding to the piezoelectric ceramic compositions according to the first and third embodiments of the present invention exhibited high mechanical quality factors Qm not lower than 1200 in low-field driving (0.1 Vrms), and also exhibited high Qm values not lower than 1100 even in high-field driving (5 Vrms). Also, specimens corresponding to the piezoelectric ceramic compositions according to the second and fourth embodiments of the present invention (specimens of Nos. 29, 30, 31, and 34) exhibited high Qm values at a sintering temperature lower than 1100° C., indicating that they could be sintered together with a silver-palladium paste.

Whereas the specimens of Comparative Examples (specimens of Nos. 1, 5, 10, 13, 14, 17, 18, 22, and 32) exhibited significantly lower Qm values in high-field driving.

Example 2

Examples and Comparative Examples of the piezoelectric ceramic compositions according to the first through fourth embodiments and modifications thereof will be described below.

Granules obtained in the same manner as Example 1 were molded into a disc having a diameter of 20 mm and a thickness of about 2 mm using a mold and a press. After the binder was removed from the molded article by allowing the molded article to stand in the air at 700° C. for 1 hour, the molded article was sintered in the air at 1000–1260° C. for 2 hours. After the sintered article was machined into a disc having a diameter of about 16 mm and a thickness of about 1 mm, silver electrodes were formed on the both major surface of the disc by baking, and polarization treatment was performed in an insulation oil at 100° C. by impressing a DC electric field of 1–5 kV/mm. From the measurement of the obtained disc specimen with the resonance-antiresonance method using an impedance analyzer, the mechanical quality factor Qm of the oscillation in the radial direction of the disc was obtained. Here, the Qm values when the impressed voltage was 0.1 Vrms and when it was 5 Vrms were obtained to evaluate the degree of Qm lowering due to high-field driving.

Table 2 shows the compositions, sintering temperatures, and Qm values when the impressed voltage was 0.1 Vrms and when it was 5 Vrms. Asterisks (*) indicated to the right of the specimen numbers indicate that such samples are beyond the scope of the claim of the present invention.

TABLE 2

| Specimen No. | A | u | v | w | x | y | z | t | ZnO (Mole %) | Sintering temperature (° C.) | Qm 0.1 V | Qm 5 V |
|---|---|---|---|---|---|---|---|---|---|---|---|---|
| 35* | — | 1 | 1 | 0.12 | 0.09 | 0.41 | 0.38 | 0.980 | 0 | 1230 | 2350 | 610 |
| 36 | La | 0.99 | 1 | 0.12 | 0.09 | 0.41 | 0.38 | 0.980 | 0 | 1230 | 2250 | 1450 |
| 37 | La | 0.94 | 1 | 0.12 | 0.09 | 0.41 | 0.38 | 0.980 | 0 | 1230 | 2540 | 1980 |
| 38 | La | 0.90 | 1 | 0.12 | 0.09 | 0.41 | 0.38 | 0.980 | 0 | 1260 | 1750 | 1600 |
| 39* | La | 0.80 | 1 | 0.12 | 0.09 | 0.41 | 0.38 | 0.980 | 0 | 1260 | 650 | 320 |
| 40 | Bi | 0.99 | 1 | 0.12 | 0.09 | 0.41 | 0.38 | 0.980 | 0 | 1230 | 2120 | 1460 |
| 41 | Bi | 0.94 | 1 | 0.12 | 0.09 | 0.41 | 0.38 | 0.980 | 0 | 1170 | 1780 | 1600 |
| 42 | Bi | 0.90 | 1 | 0.12 | 0.09 | 0.41 | 0.38 | 0.980 | 0 | 1170 | 1540 | 1410 |
| 43 | La½Bi½ | 0.94 | 1 | 0.12 | 0.09 | 0.41 | 0.38 | 0.980 | 0 | 1200 | 1850 | 1700 |
| 44* | La | 0.94 | 0.90 | 0.12 | 0.09 | 0.41 | 0.38 | 0.980 | 0 | 1260 | 450 | 180 |
| 45 | La | 0.94 | 0.97 | 0.12 | 0.09 | 0.41 | 0.38 | 0.980 | 0 | 1260 | 1520 | 1200 |
| 46 | La | 0.94 | 1.03 | 0.12 | 0.09 | 0.41 | 0.38 | 0.980 | 0 | 1200 | 2020 | 1630 |
| 47* | La | 0.94 | 1.1 | 0.12 | 0.09 | 0.41 | 0.38 | 0.980 | 0 | 1170 | 420 | 21 |
| 48* | — | 1 | 1 | 0 | 0 | 0.48 | 0.52 | 0.980 | 0 | 1140 | 750 | 230 |
| 49 | La | 0.96 | 1 | 0.01 | 0.01 | 0.48 | 0.50 | 0.980 | 0 | 1110 | 1650 | 1400 |
| 50 | La | 0.96 | 1 | 0.20 | 0.15 | 0.35 | 0.30 | 0.980 | 0 | 1260 | 1890 | 1710 |
| 51* | La | 0.96 | 1 | 0.25 | 0.25 | 0.28 | 0.22 | 0.980 | 0 | 1260 | 630 | 480 |
| 52* | La | 0.96 | 1 | 0.09 | 0.09 | 0.42 | 0.40 | 1.000 | 0 | 1260 | 320 | 80 |
| 53 | La | 0.96 | 1 | 0.09 | 0.09 | 0.42 | 0.40 | 0.999 | 0 | 1260 | 1180 | 1090 |

TABLE 2-continued

| Specimen No. | A | u | v | w | x | y | z | t | ZnO (Mole %) | Sintering temperature (° C.) | Qm 0.1 V | Qm 5 V |
|---|---|---|---|---|---|---|---|---|---|---|---|---|
| 54 | La | 0.96 | 1 | 0.09 | 0.09 | 0.42 | 0.40 | 0.970 | 0 | 1230 | 1950 | 1620 |
| 55 | La | 0.96 | 1 | 0.09 | 0.09 | 0.42 | 0.40 | 0.960 | 0 | 1200 | 1630 | 1540 |
| 56* | La | 0.96 | 1 | 0.09 | 0.09 | 0.42 | 0.40 | 0.900 | 0 | 1200 | 390 | 150 |
| 57 | La | 0.99 | 1 | 0.12 | 0.06 | 0.42 | 0.40 | 0.980 | 0 | 1110 | 2420 | 1810 |
| 58 | La | 0.92 | 1 | 0.12 | 0.06 | 0.42 | 0.40 | 0.980 | 0 | 1140 | 2680 | 2320 |
| 59 | La | 0.96 | 1 | 0.09 | 0.05 | 0.43 | 0.43 | 0.999 | 0 | 1110 | 1520 | 1230 |
| 60 | La | 0.96 | 1 | 0.09 | 0.05 | 0.43 | 0.43 | 0.970 | 0 | 1110 | 2010 | 1690 |
| 61 | La | 0.96 | 1 | 0.09 | 0.05 | 0.43 | 0.43 | 0.960 | 0 | 1110 | 1820 | 1410 |
| 62 | Nd | 0.94 | 1 | 0.12 | 0.09 | 0.41 | 0.38 | 0.980 | 0 | 1230 | 2470 | 1850 |
| 63 | Nd | 0.94 | 1 | 0.12 | 0.09 | 0.41 | 0.38 | 0.980 | 0.5 | 1080 | 2320 | 1820 |
| 64 | Nd | 0.94 | 1 | 0.12 | 0.09 | 0.41 | 0.38 | 0.980 | 1 | 1080 | 1930 | 1710 |
| 65 | Nd | 0.94 | 1 | 0.12 | 0.09 | 0.41 | 0.38 | 0.980 | 2 | 1000 | 1600 | 1350 |
| 66* | Nd | 0.94 | 1 | 0.12 | 0.09 | 0.41 | 0.38 | 0.980 | 4 | 1000 | 710 | 530 |
| 67 | Pr | 0.94 | 1 | 0.12 | 0.09 | 0.41 | 0.38 | 0.980 | 0 | 1260 | 2150 | 1920 |
| 68 | Pr | 0.94 | 1 | 0.12 | 0.09 | 0.41 | 0.38 | 0.980 | 1 | 1080 | 1790 | 1600 |

As is obvious from the results shown in Table 2, specimens corresponding to the piezoelectric ceramic compositions according to the modifications of the first and third embodiments of the present invention exhibited high mechanical quality factors Qm not lower than 1100 in low-field driving (0.1 Vrms), and also exhibited high Qm values not lower than 1000 even in high-field driving (5 Vrms). Also, specimens corresponding to the piezoelectric ceramic compositions according to the second and fourth embodiments of the present invention (specimens of Nos. 63, 64, 65, and 68) further exhibited high Qm values at a sintering temperature lower than 1100° C., indicating that they could be sintered together with a silver-palladium paste.

Whereas the specimens of Comparative Examples (specimens of Nos. 35, 39, 44, 47, 48, 51, 52, 56, and 66) exhibited significantly lower Qm values in high-field driving.

Example 3

Examples and Comparative Examples of the piezoelectric transformers according to the first and second embodiments will be described below referring to FIG. 1. FIG. 1 shows the appearance of a piezoelectric transformer according to the present invention.

Granules obtained in the same manner as Example 1 were molded into a rectangular plate having a length of 50 mm, a width of 10 mm, and a thickness of about 3 mm using a mold and a press. After the binder was removed from the molded article by allowing the molded article to stand in the air at 700° C. for 1 hour, the molded article was sintered in the air at 1000–1260° C. for 2 hours. The sintered article was machined into rectangular plates having a length of 40 mm, a width of 7 mm, and a thickness of 2 mm and 1 mm. The piezoelectric body driving portion 1 was formed by the silver baking of input electrodes 3a and 3b on the major surface, and subjected to polarization treatment in the thickness direction. The piezoelectric body power generating portion 2 was formed by forming the output electrode 4 having a width of 1 mm, and subjected to polarization treatment in the length direction between the input electrodes 3a, 3b and the output electrode 4. Arrows in FIG. 1 show the directions of polarization axes. The length of each of the piezoelectric body driving portion 1 and the piezoelectric body power generating portion 2 was 20 mm, respectively. A load resistance of 100 kΩ was connected to the output electrode 4, and AC electric signals were supplied to the input electrodes 3a and 3b to excite them to make mechanical oscillation. The evaluation of efficiency was performed for the one-wavelength mode (λ-mode) of stretching oscillation in the length direction. The input electric power Win was 3 W, and the resonant frequency was about 80 kHz.

Table 3 shows the compositions, the thickness of piezoelectric elements, and the efficiencies of piezoelectric transformers. Asterisks (*) indicated to the right of the specimen numbers indicate that such samples are beyond the scope of the claim of the present invention.

TABLE 3

| Specimen No. | A | u | v | w | x | y | z | MnO$_2$ (Mole %) | ZnO (Mole %) | Element thickness (mm) | Efficiency (%) |
|---|---|---|---|---|---|---|---|---|---|---|---|
| 69* | — | 1 | 1 | 0.09 | 0.09 | 0.42 | 0.40 | 1 | 0 | 2 | 84.3 |
| 70* | — | 1 | 1 | 0.09 | 0.09 | 0.42 | 0.40 | 1 | 0 | 1 | 75.0 |
| 71 | La | 0.99 | 1 | 0.09 | 0.09 | 0.42 | 0.40 | 1 | 0 | 2 | 95.3 |
| 72 | La | 0.99 | 1 | 0.09 | 0.09 | 0.42 | 0.40 | 1 | 0 | 1 | 90.8 |
| 73 | La | 0.94 | 1 | 0.09 | 0.09 | 0.42 | 0.40 | 1 | 0 | 2 | 97.8 |
| 74 | La | 0.94 | 1 | 0.09 | 0.09 | 0.42 | 0.40 | 1 | 0 | 1 | 94.2 |
| 75 | La | 0.85 | 1 | 0.09 | 0.09 | 0.42 | 0.40 | 1 | 0 | 2 | 93.6 |
| 76 | La | 0.85 | 1 | 0.09 | 0.09 | 0.42 | 0.40 | 1 | 0 | 1 | 90.2 |
| 77 | La½Bi½ | 0.94 | 1 | 0.09 | 0.09 | 0.42 | 0.40 | 1 | 0 | 2 | 98.5 |
| 78 | La½bi½ | 0.94 | 1 | 0.09 | 0.09 | 0.42 | 0.40 | 1 | 0 | 1 | 93.8 |
| 79* | La | 0.94 | 0.90 | 0.09 | 0.09 | 0.42 | 0.40 | 1 | 0 | 2 | 75.2 |
| 80* | La | 0.94 | 0.90 | 0.09 | 0.09 | 0.42 | 0.40 | 1 | 0 | 1 | 52.9 |
| 81 | La | 0.94 | 0.97 | 0.09 | 0.09 | 0.42 | 0.40 | 1 | 0 | 2 | 97.5 |
| 82 | La | 0.94 | 0.97 | 0.09 | 0.09 | 0.42 | 0.40 | 1 | 0 | 1 | 91.3 |
| 83 | La | 0.94 | 1.03 | 0.09 | 0.09 | 0.42 | 0.40 | 1 | 0 | 2 | 98.6 |
| 84 | La | 0.94 | 1.03 | 0.09 | 0.09 | 0.42 | 0.40 | 1 | 0 | 1 | 93.1 |
| 85* | La | 0.94 | 1.1 | 0.09 | 0.09 | 0.42 | 0.40 | 1 | 0 | 2 | 63.2 |
| 86* | La | 0.94 | 1.1 | 0.09 | 0.09 | 0.42 | 0.40 | 1 | 0 | 1 | 42.3 |
| 87* | — | 1 | 1 | 0 | 0 | 0.48 | 0.52 | 1 | 0 | 2 | 52.1 |
| 88* | — | 1 | 1 | 0 | 0 | 0.48 | 0.52 | 1 | 0 | 1 | 37.3 |
| 89 | La | 0.96 | 1 | 0.01 | 0.01 | 0.48 | 0.50 | 1 | 0 | 2 | 93.8 |
| 90 | La | 0.96 | 1 | 0.01 | 0.01 | 0.48 | 0.50 | 1 | 0 | 1 | 90.2 |
| 91 | La | 0.96 | 1 | 0.20 | 0.15 | 0.35 | 0.30 | 1 | 0 | 2 | 96.5 |
| 92 | La | 0.96 | 1 | 0.20 | 0.15 | 0.35 | 0.30 | 1 | 0 | 1 | 92.3 |
| 93* | La | 0.94 | 1 | 0.09 | 0.09 | 0.42 | 0.40 | 0 | 0 | 2 | 68.9 |
| 94* | La | 0.94 | 1 | 0.09 | 0.09 | 0.42 | 0.40 | 0 | 0 | 1 | 42.1 |
| 95 | La | 0.94 | 1 | 0.09 | 0.09 | 0.42 | 0.40 | 0.1 | 0 | 2 | 94.1 |
| 96 | La | 0.94 | 1 | 0.09 | 0.09 | 0.42 | 0.40 | 0.1 | 0 | 1 | 90.9 |
| 97 | La | 0.94 | 1 | 0.09 | 0.09 | 0.42 | 0.40 | 3 | 0 | 2 | 96.3 |
| 98 | La | 0.94 | 1 | 0.09 | 0.09 | 0.42 | 0.40 | 3 | 0 | 1 | 92.1 |
| 99 | La | 0.99 | 1 | 0.12 | 0.06 | 0.42 | 0.40 | 1 | 0 | 2 | 98.9 |
| 100 | La | 0.99 | 1 | 0.12 | 0.06 | 0.42 | 0.40 | 1 | 0 | 1 | 93.6 |
| 101 | La | 0.94 | 1 | 0.12 | 0.06 | 0.42 | 0.40 | 1 | 0 | 2 | 98.6 |
| 102 | La | 0.94 | 1 | 0.12 | 0.06 | 0.42 | 0.40 | 1 | 0 | 1 | 96.3 |
| 103 | La | 0.96 | 1 | 0.09 | 0.05 | 0.43 | 0.43 | 1 | 0 | 2 | 98.1 |
| 104 | La | 0.96 | 1 | 0.09 | 0.05 | 0.43 | 0.43 | 1 | 0 | 1 | 97.0 |
| 105 | La | 0.96 | 1 | 0.09 | 0.05 | 0.43 | 0.43 | 0.1 | 0 | 2 | 93.2 |
| 106 | La | 0.96 | 1 | 0.09 | 0.05 | 0.43 | 0.43 | 0.1 | 0 | 1 | 90.1 |
| 107 | La | 0.96 | 1 | 0.09 | 0.05 | 0.43 | 0.43 | 3 | 0 | 2 | 96.2 |
| 108 | La | 0.96 | 1 | 0.09 | 0.05 | 0.43 | 0.43 | 3 | 0 | 1 | 92.6 |
| 109 | Nd | 0.94 | 1 | 0.09 | 0.09 | 0.42 | 0.40 | 1 | 0 | 2 | 98.3 |
| 110 | Nd | 0.94 | 1 | 0.09 | 0.09 | 0.42 | 0.40 | 1 | 0 | 1 | 94.5 |
| 111 | Nd | 0.94 | 1 | 0.09 | 0.09 | 0.42 | 0.40 | 1 | 1 | 2 | 97.9 |
| 112 | Nd | 0.94 | 1 | 0.09 | 0.09 | 0.42 | 0.40 | 1 | 1 | 1 | 94.3 |
| 113 | Pr | 0.94 | 1 | 0.09 | 0.09 | 0.42 | 0.40 | 1 | 0 | 2 | 97.2 |
| 114 | Pr | 0.94 | 1 | 0.09 | 0.09 | 0.42 | 0.40 | 1 | 0 | 1 | 93.0 |
| 115 | Pr | 0.94 | 1 | 0.09 | 0.09 | 0.42 | 0.40 | 1 | 1 | 2 | 96.1 |
| 116 | Pr | 0.94 | 1 | 0.09 | 0.09 | 0.42 | 0.40 | 1 | 1 | 1 | 93.6 |

As is obvious from the results shown in Table 3, specimens corresponding to the piezoelectric transformer according to the first embodiment of the present invention exhibited a high efficiency of 90% or more even when the thickness of the piezoelectric element is as thin as 1 mm. Also, specimens corresponding to the piezoelectric transformers according to the second embodiment of the present invention (specimens of Nos. 111, 112, 115, and 116) further exhibited high efficiencies at a sintering temperature lower than 1100° C., indicating that they could be sintered together with a silver-palladium paste to form a laminated structure. Actually, a high conversion efficiency and a high boosting ratio were verified when a laminated piezoelectric transformer comprising 9 layers of piezoelectric bodies (having the composition of the specimen No. 111) and 10 layers of silver-palladium electrodes was fabricated, and its transformer properties were evaluated.

On the contrary, the specimens of Comparative Examples (specimens of Nos. 69, 70, 79, 80, 85, 86, 87, 88, 93, and 94) were known to have significantly lowered efficiencies especially when the thickness of the piezoelectric element was as thin as 1 mm.

The evaluation of temperature rise of the specimen No. 70 (Comparative Example) and specimen No. 110 after continuous driving for 20 minutes showed that their temperature rises when the room temperature was 25° C. were 36° C. and 16° C., respectively, and that the piezoelectric devices using piezoelectric ceramic compositions according to the first and second embodiment of the present invention produced little heat in high-field driving, enabling a high output.

Example 4

Examples and Comparative Examples of the piezoelectric transformers according to the modifications of the first and second embodiments will be described below referring to FIG. 1. FIG. 1 shows the appearance of a piezoelectric transformer according to the present invention.

Granules obtained in the same manner as Example 1 were molded into a rectangular plate having a length of 50 mm, a width of 10 mm, and a thickness of about 3 mm using a mold and a press. After the binder was removed from the molded article by allowing the molded article to stand in the air at 700° C. for 1 hour, the molded article was sintered in the air at 1000–1260° C. for 2 hours. The sintered article was machined into rectangular plates having a length of 40 mm, a width of 7 mm, and a thickness of 2 mm and 1 mm. The piezoelectric body driving portion 1 was formed by the silver baking of input electrodes 3a and 3b on the major surface, and subjected to polarization treatment in the thickness direction. The piezoelectric body power generating portion 2 was formed by forming the output electrode 4 having a width of 1 mm, and subjected to polarization treatment in the length direction between the input electrodes 3a, 3b and the output electrode 4. Arrows in FIG. 1 show the directions of polarization axes. The length of each of the piezoelectric body driving portion 1 and the piezoelectric body power generating portion 2 was 20 mm, respectively. A load resistance of 100 kΩ was connected to the output electrode 4, and AC electric signals were supplied to the input electrodes 3a and 3b to excite them to make mechanical oscillation. The evaluation of efficiency was performed for the one-wavelength mode (λ-mode) of stretching oscillation in the length direction. The input electric power Win was 3 W, and the resonant frequency was about 80 kHz.

Table 4 shows the compositions, the thickness of piezoelectric elements, and the efficiencies of piezoelectric transformers. Asterisks (*) indicated to the right of the specimen numbers indicate that such samples are beyond the scope of the claim of the present invention.

TABLE 4

| Specimen No. | A | u | v | w | x | y | z | t | ZnO (Mole %) | Element thickness (mm) | Efficiency (%) |
|---|---|---|---|---|---|---|---|---|---|---|---|
| 117 | La | 0.99 | 1 | 0.12 | 0.09 | 0.41 | 0.38 | 0.980 | 0 | 2 | 97.2 |
| 118 | La | 0.99 | 1 | 0.12 | 0.09 | 0.41 | 0.38 | 0.980 | 0 | 1 | 91.0 |
| 119 | La | 0.90 | 1 | 0.12 | 0.09 | 0.41 | 0.38 | 0.980 | 0 | 2 | 96.8 |
| 120 | La | 0.90 | 1 | 0.12 | 0.09 | 0.41 | 0.38 | 0.980 | 0 | 1 | 94.8 |
| 121 | La½Bi½ | 0.94 | 1 | 0.12 | 0.09 | 0.41 | 0.38 | 0.980 | 0 | 2 | 97.3 |
| 122 | La½Bi½ | 0.94 | 1 | 0.12 | 0.09 | 0.41 | 0.38 | 0.980 | 0 | 1 | 92.8 |
| 123* | La | 0.94 | 0.90 | 0.12 | 0.09 | 0.41 | 0.38 | 0.980 | 0 | 2 | 65.4 |
| 124* | La | 0.94 | 0.90 | 0.12 | 0.09 | 0.41 | 0.38 | 0.980 | 0 | 1 | 46.0 |
| 125 | La | 0.94 | 0.97 | 0.12 | 0.09 | 0.41 | 0.38 | 0.980 | 0 | 2 | 94.5 |
| 126 | La | 0.94 | 0.97 | 0.12 | 0.09 | 0.41 | 0.38 | 0.980 | 0 | 1 | 91.1 |
| 127 | La | 0.94 | 1.03 | 0.12 | 0.09 | 0.41 | 0.38 | 0.980 | 0 | 2 | 98.6 |
| 128 | La | 0.94 | 1.03 | 0.12 | 0.09 | 0.41 | 0.38 | 0.980 | 0 | 1 | 96.2 |
| 129* | — | 1 | 1 | 0 | 0 | 0.48 | 0.52 | 0.980 | 0 | 2 | 64.9 |
| 130* | — | 1 | 1 | 0 | 0 | 0.48 | 0.52 | 0.980 | 0 | 1 | 38.7 |
| 131 | La | 0.96 | 1 | 0.01 | 0.01 | 0.48 | 0.50 | 0.980 | 0 | 2 | 93.8 |
| 132 | La | 0.96 | 1 | 0.01 | 0.01 | 0.48 | 0.50 | 0.980 | 0 | 1 | 90.2 |
| 133 | La | 0.96 | 1 | 0.20 | 0.15 | 0.35 | 0.30 | 0.980 | 0 | 2 | 97.5 |
| 134 | La | 0.96 | 1 | 0.20 | 0.15 | 0.35 | 0.30 | 0.980 | 0 | 1 | 93.6 |
| 135* | La | 0.96 | 1 | 0.09 | 0.09 | 0.42 | 0.40 | 1.000 | 0 | 2 | 42.1 |
| 136* | La | 0.96 | 1 | 0.09 | 0.09 | 0.42 | 0.40 | 1.000 | 0 | 1 | 32.9 |
| 137 | La | 0.96 | 1 | 0.09 | 0.09 | 0.42 | 0.40 | 0.999 | 0 | 2 | 92.7 |
| 138 | La | 0.96 | 1 | 0.09 | 0.09 | 0.42 | 0.40 | 0.999 | 0 | 1 | 90.1 |
| 139 | La | 0.96 | 1 | 0.09 | 0.09 | 0.42 | 0.40 | 0.960 | 0 | 2 | 98.3 |
| 140 | La | 0.96 | 1 | 0.09 | 0.09 | 0.42 | 0.40 | 0.960 | 0 | 1 | 92.0 |
| 141 | La | 0.99 | 1 | 0.12 | 0.06 | 0.42 | 0.40 | 0.980 | 0 | 2 | 98.7 |
| 142 | La | 0.99 | 1 | 0.12 | 0.06 | 0.42 | 0.40 | 0.980 | 0 | 1 | 95.1 |
| 143 | La | 0.92 | 1 | 0.12 | 0.06 | 0.42 | 0.40 | 0.980 | 0 | 2 | 98.6 |
| 144 | La | 0.92 | 1 | 0.12 | 0.06 | 0.42 | 0.40 | 0.980 | 0 | 1 | 96.7 |
| 145 | La | 0.96 | 1 | 0.09 | 0.05 | 0.43 | 0.43 | 0.999 | 0 | 2 | 96.4 |
| 146 | La | 0.96 | 1 | 0.09 | 0.05 | 0.43 | 0.43 | 0.999 | 0 | 1 | 93.0 |
| 147 | La | 0.96 | 1 | 0.09 | 0.05 | 0.43 | 0.43 | 0.970 | 0 | 2 | 97.0 |
| 148 | La | 0.96 | 1 | 0.09 | 0.05 | 0.43 | 0.43 | 0.970 | 0 | 1 | 93.5 |
| 149 | La | 0.96 | 1 | 0.09 | 0.05 | 0.43 | 0.43 | 0.960 | 0 | 2 | 94.9 |
| 150 | La | 0.96 | 1 | 0.09 | 0.05 | 0.43 | 0.43 | 0.960 | 0 | 1 | 90.8 |
| 151 | Nd | 0.92 | 1 | 0.12 | 0.06 | 0.42 | 0.40 | 0.980 | 0 | 2 | 98.3 |
| 152 | Nd | 0.92 | 1 | 0.12 | 0.06 | 0.42 | 0.40 | 0.980 | 0 | 1 | 97.1 |
| 153 | Nd | 0.92 | 1 | 0.12 | 0.06 | 0.42 | 0.40 | 0.980 | 1 | 2 | 97.1 |
| 154 | Nd | 0.92 | 1 | 0.12 | 0.06 | 0.42 | 0.40 | 0.980 | 1 | 1 | 95.7 |
| 155 | Pr | 0.92 | 1 | 0.12 | 0.06 | 0.42 | 0.40 | 0.980 | 0 | 2 | 97.4 |
| 156 | Pr | 0.92 | 1 | 0.12 | 0.06 | 0.42 | 0.40 | 0.980 | 0 | 1 | 95.1 |
| 157 | Pr | 0.92 | 1 | 0.12 | 0.06 | 0.42 | 0.40 | 0.980 | 1 | 2 | 96.3 |
| 158 | Pr | 0.92 | 1 | 0.12 | 0.06 | 0.42 | 0.40 | 0.980 | 1 | 1 | 93.0 |

As is obvious from the results shown in Table 4, specimens corresponding to the piezoelectric transformer according to the modification of the first embodiment of the present invention exhibited a high efficiency of 90% or more even when the thickness of the piezoelectric element is as thin as 1 mm. Also, specimens corresponding to the piezoelectric transformers according to the modification of the second embodiment of the present invention (specimens of Nos. 153, 154, 157, and 158) further exhibited high efficiencies at a sintering temperature lower than 1100° C., indicating that they could be sintered together with a silver-palladium paste to form a laminated structure. Actually, a high conversion efficiency and a high boosting ratio were verified when a laminated piezoelectric transformer comprising 9 layers of piezoelectric bodies (having the composition of the specimen No. 153) and 10 layers of silver-palladium electrodes was fabricated, and its transformer properties were evaluated.

Whereas, the specimens of Comparative Examples (specimens of Nos. 123, 124, 129, 130, 135, and 136) were known to have significantly lowered efficiencies especially when the thickness of the piezoelectric element was as thin as 1 mm.

The evaluation of temperature rise of the specimen No. 124 (Comparative Example) and specimen No. 154 after continuous driving for 20 minutes showed that their temperature rises when the room temperature was 25° C. were 62° C. and 18° C., respectively, and that the piezoelectric devices using piezoelectric ceramic compositions according to the modifications of the first and second embodiment of the present invention produced little heat in high-field driving, enabling a high output.

Example 5

Examples and Comparative Examples of the piezoelectric transformers according to the third and fourth embodiments will be described below referring to the drawing. FIG. 2 shows the appearance of a piezoelectric transformer according to the present invention.

Granules obtained in the same manner as Example 1 were molded into a rectangular plate having a length of 50 mm, a width of 10 mm, and a thickness of about 3 mm using a mold and a press. After the binder was removed from the molded article by allowing the molded article to stand in the air at 700° C. for 1 hour, the molded article was sintered in the air at 1000–1260° C. for 2 hours. The sintered article was machined into rectangular plate having a length of 40 mm, a width of 7 mm, and a thickness of 1 mm. The piezoelectric body driving portion 5 was formed by the silver baking of input electrodes 8a and 8b on the major surface, and subjected to polarization treatment in the thickness direction. The piezoelectric body power generating portions 6 and 7 were formed by forming the output electrodes 9a, 9b, 9c, and 9d having a width of 1 mm, and subjected to polarization treatment in the length direction between the input electrodes 8a, 8b and the output electrodes 9a, 9b and the output electrodes 9c, 9d, respectively. Arrows in FIG. 2 show the directions of polarization axes. The length of the piezoelectric body driving portion 5 was 24 mm and that of the piezoelectric body power generating portions 6 and 7 was 8 mm, respectively. Four lead wires were connected to a load resistance of 120 k$\Omega$, and each of the lead wires was connected to the output electrodes 9a, 9b, 9c, and 9d. AC electric signals were supplied to the input electrodes 8a and 8b to excite them to make mechanical oscillation. The evaluation of efficiency was performed for the half-wavelength mode ($\lambda/2$-mode) of stretching oscillation in the length direction. The input electric power Win was 3 W, and the resonant frequency was about 40 kHz.

Table 5 shows the compositions and the efficiencies of piezoelectric transformers in the half-wavelength mode. Asterisks (*) indicated to the right of the specimen numbers indicate that such samples are beyond the scope of the claim of the present invention.

TABLE 5

| Specimen No. | A | u | v | w | x | y | z | MnO$_2$ (Mole %) | ZnO (Mole %) | Efficiency (%) |
|---|---|---|---|---|---|---|---|---|---|---|
| 159* | — | 1 | 1 | 0.09 | 0.09 | 0.42 | 0.40 | 1 | 0 | 71.3 |
| 160 | La | 0.99 | 1 | 0.09 | 0.09 | 0.42 | 0.40 | 1 | 0 | 86.2 |
| 161 | La | 0.94 | 1 | 0.09 | 0.09 | 0.42 | 0.40 | 1 | 0 | 91.6 |
| 162 | La | 0.85 | 1 | 0.09 | 0.09 | 0.42 | 0.40 | 1 | 0 | 85.9 |
| 163 | La½Bi½ | 0.94 | 1 | 0.09 | 0.09 | 0.42 | 0.40 | 1 | 0 | 89.0 |
| 164* | La | 0.94 | 0.90 | 0.09 | 0.09 | 0.42 | 0.40 | 1 | 0 | 46.0 |
| 165 | La | 0.94 | 0.97 | 0.09 | 0.09 | 0.42 | 0.40 | 1 | 0 | 88.9 |
| 166 | La | 0.94 | 1.03 | 0.09 | 0.09 | 0.42 | 0.40 | 1 | 0 | 90.8 |
| 167* | La | 0.94 | 1.1 | 0.09 | 0.09 | 0.42 | 0.40 | 1 | 0 | 35.2 |
| 168* | — | 1 | 1 | 0 | 0 | 0.48 | 0.52 | 1 | 0 | 30.2 |
| 169 | La | 0.96 | 1 | 0.01 | 0.01 | 0.48 | 0.50 | 1 | 0 | 86.9 |
| 170 | La | 0.96 | 1 | 0.20 | 0.15 | 0.35 | 0.30 | 1 | 0 | 88.7 |
| 171* | La | 0.94 | 1 | 0.09 | 0.09 | 0.42 | 0.40 | 0 | 0 | 31.6 |
| 172 | La | 0.94 | 1 | 0.09 | 0.09 | 0.42 | 0.40 | 0.1 | 0 | 88.3 |
| 173 | La | 0.94 | 1 | 0.09 | 0.09 | 0.42 | 0.40 | 3 | 0 | 89.6 |
| 174 | La | 0.99 | 1 | 0.12 | 0.06 | 0.42 | 0.40 | 1 | 0 | 90.3 |
| 175 | La | 0.94 | 1 | 0.12 | 0.06 | 0.42 | 0.40 | 1 | 0 | 92.1 |
| 176 | La | 0.96 | 1 | 0.09 | 0.05 | 0.43 | 0.43 | 1 | 0 | 93.5 |
| 177 | La | 0.96 | 1 | 0.09 | 0.05 | 0.43 | 0.43 | 0.1 | 0 | 86.3 |
| 178 | La | 0.96 | 1 | 0.09 | 0.05 | 0.43 | 0.43 | 3 | 0 | 89.3 |
| 179 | Nd | 0.94 | 1 | 0.09 | 0.09 | 0.42 | 0.40 | 1 | 0 | 92.4 |
| 180 | Nd | 0.94 | 1 | 0.09 | 0.09 | 0.42 | 0.40 | 1 | 1 | 91.9 |
| 181 | Pr | 0.94 | 1 | 0.09 | 0.09 | 0.42 | 0.40 | 1 | 0 | 90.8 |
| 182 | Pr | 0.94 | 1 | 0.09 | 0.09 | 0.42 | 0.40 | 1 | 1 | 89.6 |

Resonant frequencies of stretching oscillation in the length direction vary depending on the oscillation mode. When the resonant frequency is 40 kHz, the length of the piezoelectric element in the one-wavelength mode ($\lambda$-mode) is about 80 mm, while the length of the piezoelectric element in the half-wavelength mode ($\lambda/2$-mode) is about 40 mm. That is, in order to realize a piezoelectric transformer of a reduced size, it is effective to make the oscillation mode the half-wavelength mode. However, since the oscillation amplitude increases and mechanical strain increases as the resonant frequency is lowered, the efficiency of the piezoelectric transformer lowers.

However, as is obvious from the results shown in Table 5, the specimen corresponding to the piezoelectric transformer according to the third embodiment of the present invention exhibits a high efficiency of 85% or more even when the driving frequency is as low as 40 kHz. Also, specimens corresponding to the piezoelectric transformers according to the fourth embodiment of the present invention (specimens of Nos. 180 and 182) further exhibited high efficiencies at a sintering temperature lower than 1100° C., indicating that they could be sintered together with a silver-palladium paste to form a laminated structure. Actually, a high conversion efficiency and a high boosting ratio were verified when a laminated piezoelectric transformer comprising 9 layers of piezoelectric bodies (having the composition of the specimen No. 180) and 10 layers of silver-palladium electrodes was fabricated, and its transformer properties were evaluated.

Whereas, the specimens of Comparative Examples (specimens of Nos. 159, 164, 167, 168, and 171) had significantly low efficiencies.

Example 6

Examples and Comparative Examples of the piezoelectric transformers according to the modifications of the third and fourth embodiments will be described below referring to the drawing. FIG. 2 shows the appearance of a piezoelectric transformer according to the present invention.

Granules obtained in the same manner as Example 1 were molded into a rectangular plate having a length of 50 mm, a width of 10 mm, and a thickness of about 3 mm using a mold and a press. After the binder was removed from the molded article by allowing the molded article to stand in the air at 700° C. for 1 hour, the molded article was sintered in the air at 1000–1260° C. for 2 hours. The sintered article was machined into a rectangular plate having a length of 40 mm, a width of 7 mm, and a thickness of 1 mm. The piezoelectric body driving portion 5 was formed by the silver baking of input electrodes 8a and 8b on the major surface, and subjected to polarization treatment in the thickness direction. The piezoelectric body power generating portions 6 and 7 were formed by forming the output electrodes 9a, 9b, 9c, and 9d having a width of 1 mm, and subjected to polarization treatment in the length direction between the input electrodes 8a, 8b and the output electrodes 9a, 9b and the output electrodes 9c, 9d, respectively. Arrows in FIG. 2 show the directions of polarization axes. The length of the piezoelectric body driving portion 5 was 24 mm and that of the piezoelectric body power generating portions 6 and 7 8 mm, respectively. Four lead wires were connected to a load resistance of 120 kΩ, and each of the lead wires was connected to the output electrodes 9a, 9b, 9c, and 9d. AC electric signals were supplied to the input electrodes 8a and 8b to excite them to make mechanical oscillation. The evaluation of efficiency was performed for the half-wavelength mode ($\lambda/2$-mode) of stretching oscillation in the length direction. The input electric power Win was 3 W, and the resonant frequency was about 40 kHz.

Table 6 shows the compositions and the efficiencies of piezoelectric transformers in the half-wavelength mode. Asterisks (*) indicated to the right of the specimen numbers indicate that such samples are beyond the scope of the claim of the present invention.

TABLE 6

| Specimen No. | A | u | v | w | x | y | z | t | ZnO (Mole %) | Efficiency (%) |
|---|---|---|---|---|---|---|---|---|---|---|
| 183 | La | 0.99 | 1 | 0.12 | 0.09 | 0.41 | 0.38 | 0.980 | 0 | 87.9 |
| 184 | La | 0.90 | 1 | 0.12 | 0.09 | 0.41 | 0.38 | 0.980 | 0 | 91.8 |
| 185 | La½Bi½ | 0.94 | 1 | 0.12 | 0.09 | 0.41 | 0.38 | 0.980 | 0 | 90.5 |
| 186* | La | 0.94 | 0.90 | 0.12 | 0.09 | 0.41 | 0.38 | 0.980 | 0 | 32.6 |
| 187 | La | 0.94 | 0.97 | 0.12 | 0.09 | 0.41 | 0.38 | 0.980 | 0 | 87.2 |
| 188 | La | 0.94 | 1.03 | 0.12 | 0.09 | 0.41 | 0.38 | 0.980 | 0 | 94.8 |
| 189* | — | 1 | 1 | 0 | 0 | 0.48 | 0.52 | 0.980 | 0 | 31.0 |
| 190 | La | 0.96 | 1 | 0.01 | 0.01 | 0.48 | 0.50 | 0.980 | 0 | 86.9 |
| 191 | La | 0.96 | 1 | 0.20 | 0.15 | 0.35 | 0.30 | 0.980 | 0 | 90.4 |
| 192* | La | 0.96 | 1 | 0.09 | 0.09 | 0.42 | 0.40 | 1.000 | 0 | 23.0 |
| 193 | La | 0.96 | 1 | 0.09 | 0.09 | 0.42 | 0.40 | 0.999 | 0 | 87.8 |
| 194 | La | 0.96 | 1 | 0.09 | 0.09 | 0.42 | 0.40 | 0.960 | 0 | 89.9 |
| 195 | La | 0.99 | 1 | 0.12 | 0.06 | 0.42 | 0.40 | 0.980 | 0 | 93.8 |
| 196 | La | 0.92 | 1 | 0.12 | 0.06 | 0.42 | 0.40 | 0.980 | 0 | 94.0 |
| 197 | La | 0.96 | 1 | 0.09 | 0.05 | 0.43 | 0.43 | 0.999 | 0 | 90.1 |
| 198 | La | 0.96 | 1 | 0.09 | 0.05 | 0.43 | 0.43 | 0.970 | 0 | 91.3 |
| 199 | La | 0.96 | 1 | 0.09 | 0.05 | 0.43 | 0.43 | 0.960 | 0 | 86.3 |
| 200 | Nd | 0.92 | 1 | 0.12 | 0.06 | 0.42 | 0.40 | 0.980 | 0 | 92.5 |
| 201 | Nd | 0.92 | 1 | 0.12 | 0.06 | 0.42 | 0.40 | 0.980 | 1 | 92.0 |
| 202 | Pr | 0.92 | 1 | 0.12 | 0.06 | 0.42 | 0.40 | 0.980 | 0 | 91.8 |
| 203 | Pr | 0.92 | 1 | 0.12 | 0.06 | 0.42 | 0.40 | 0.980 | 1 | 90.5 |

As is obvious from the results shown in Table 6, specimens corresponding to the piezoelectric transformer according to the modification of the third embodiment of the present invention exhibited a high efficiency of 85% or more even when the driving frequency is as low as 40 kHz. Also, specimens corresponding to the piezoelectric transformers according to the modification of the fourth embodiment of the present invention (specimens of Nos. 201 and 203) further exhibited high efficiencies at a sintering temperature lower than 1100° C., indicating that they could be sintered together with a silver-palladium paste to form a laminated structure. Actually, a high conversion efficiency and a high boosting ratio were verified when a laminated piezoelectric transformer comprising 9 layers of piezoelectric bodies (having the composition of the specimen No. 203) and 10 layers of silver-palladium electrodes was fabricated, and its transformer properties were evaluated.

On the contrary, the specimens of Comparative Examples (specimens of Nos. 186, 188, and 192) had significantly low efficiencies.

Although a centrally driving type construction as FIG. 2 shows was used as a $\lambda/2$-mode piezoelectric transformer according to this embodiment, the structure is not specifically limited thereto, but the similar effects can be expected from the construction having a polarizing portion in the length direction and a polarizing portion in the thickness direction, and which can be excited in the $\lambda/2$-mode, such as the construction shown in FIG. 1.

As described above, the present invention according to claims 1 and 2 can provide a piezoelectric ceramic composition having a large mechanical quality factor, which little lowers due to high-field driving.

The present invention according to claims 3 and 4 can provide a piezoelectric ceramic composition which can be sintered at a temperature lower than 1100° C., having a large mechanical quality factor, which little lowers due to high-field driving.

The present invention according to claims 5 and 9 can provide a piezoelectric device which generates little heat during high-field driving, and enables a high output.

The present invention according to claims 6, 7, 10 and 11 can provide a piezoelectric transformer which has a high conversion efficiency and a thin thickness.

The present invention according to claims 8 and 12 can provide a piezoelectric transformer which has a high conversion efficiency even if the driving frequency is low, and has a small size.

The piezoelectric device and the piezoelectric transformer of the present invention according to claims 9 through 12 have the advantage that they can be easily laminated by sintering a piezoelectric ceramic composition together with a silver-palladium paste.

What is claimed is:

1. A piezoelectric ceramic composition represented by a composition formula, $(Pb_u A_{1-u})_v \{(Zn_{1/3}Nb_{2/3})_w(Sn_{1/3}Nb_{2/3})_x Ti_y Zr_z\}_{2-v} O_3$, where the symbol A is at least one component selected from a group consisting of La, Nd, Pr, and Bi, and u, v, w, x, y, and z are within ranges represented by the following Equations, characterized in that 0.1 to 3 mole percent of a Mn compound calculated in terms of $MnO_2$ is added to said piezoelectric ceramic composition:

$$w+x+y+z=1 \quad \text{[Equation 1]}$$

$$0.85 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50$$

2. A piezoelectric ceramic composition represented by a composition formula, $[(Pb_u A_{1-u})_v \{(Zn_{1/3}Nb_{2/3})_w(Sn_{1/3}Nb_{2/3})_x Ti_y Zr_z\}_{2-v} O_3]_t$—$(YMnO_3)_{1-t}$, where the symbol A is at least one component selected from a group consisting of La, Nd, Pr, and Bi, and t, u, v, w, x, y, and z are within ranges represented by the following Equations:

$$w+x+y+z=1 \quad \text{[Equation 2]}$$

$$0.960 \leq t \leq 0.999$$

$$0.90 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50.$$

3. A piezoelectric ceramic composition represented by a composition formula, $(Pb_u A_{1-u})_v \{(Zn_{1/3}Nb_{2/3})_w(Sn_{1/3}Nb_{2/3})_x Ti_y Zr_z\}_{2-v} O_3$, where the symbol A is at least one component selected from a group consisting of La, Nd, Pr, and Bi, and u, v, w, x, y, and z are within ranges represented by the following Equations, characterized in that 0.1 to 3 mole percent of a Mn compound calculated in terms of $MnO_2$, and 0.5 to 2 mole percent of ZnO are added to said piezoelectric ceramic composition:

$$w+x+y+z=1 \quad \text{[Equation 1]}$$

$$0.85 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50.$$

4. A piezoelectric ceramic composition represented by a composition formula, $[(Pb_u A_{1-u})_v \{(Zn_{1/3}Nb_{2/3})_w(Sn_{1/3}Nb_{2/3})_x Ti_y Zr_z\}_{2-v} O_3]_t$—$(YMnO_3)_{1-t}$, where the symbol A is at least one component selected from a group consisting of La, Nd, Pr, and Bi, and t, u, v, w, x, y, and z are within ranges represented by the following Equations, characterized in that 0.5 to 2 mole percent of ZnO is added to said piezoelectric ceramic composition:

$$w+x+y+z=1 \quad \text{[Equation 2]}$$

$$0.960 \leq t \leq 0.999$$

$$0.90 \leq u \leq 0.99$$

$$0.97 \leq v \leq 1.03$$

$$0.01 \leq w \leq 0.20$$

$$0.01 \leq x \leq 0.15$$

$$0.35 \leq y \leq 0.48$$

$$0.30 \leq z \leq 0.50.$$

5. A piezoelectric device characterized in that the piezoelectric ceramic composition according to claim 1 is used as the piezoelectric body.

6. A piezoelectric device characterized in that the piezoelectric ceramic composition according to claim 2 is used as the piezoelectric body.

7. A piezoelectric transformer characterized in that the piezoelectric device according to claim 5 is used as the piezoelectric transformer.

8. A piezoelectric transformer characterized in that the piezoelectric device according to claim 6 is used as the piezoelectric transformer.

9. The piezoelectric transformer according to claim 7 comprising a polarizing portion in the length direction and a polarizing portion in the thickness direction.

10. The piezoelectric transformer according to claim 8 comprising a polarizing portion in the length direction and a polarizing portion in the thickness direction.

11. The piezoelectric transformer according to claim 9 excited in a half-wavelength mode.

12. The piezoelectric transformer according to claim 10 excited in a half-wavelength mode.

13. A piezoelectric device, characterized by comprising the piezoelectric ceramic composition according to claim 3, and silver-palladium paste electrodes.

14. A piezoelectric device, characterized by comprising the piezoelectric ceramic composition according to claim 4, and silver-palladium paste electrodes.

15. A piezoelectric transformer characterized in that the piezoelectric device according to claim 13 is used as the piezoelectric transformer.

16. A piezoelectric transformer characterized in that the piezoelectric device according to claim 14 is used as the piezoelectric transformer.

17. The piezoelectric transformer according to claim 15, characterized by comprising a polarizing portion in the length direction and a polarizing portion in the thickness direction.

18. The piezoelectric transformer according to claim 16, characterized by comprising a polarizing portion in the length direction and a polarizing portion in the thickness direction.

19. The piezoelectric transformer according to claim 17, characterized by excited in a half-wavelength mode.

20. The piezoelectric transformer according to claim 18, characterized by excited in a half-wavelength mode.

\* \* \* \* \*